US011870344B2

(12) United States Patent
Lin et al.

(10) Patent No.: US 11,870,344 B2
(45) Date of Patent: Jan. 9, 2024

(54) VOLTAGE DOUBLER SWITCHED CAPACITOR CIRCUIT CAPABLE OF DETECTING SHORT CIRCUIT OF FLYING CAPACITOR AND DETECTION METHOD THEREOF

(71) Applicant: eGalax_eMPIA Technology Inc., Taipei (TW)

(72) Inventors: Po-Chuan Lin, Taipei (TW); I-Tsung Lee, Taipei (TW)

(73) Assignee: EGALAX EMPIA TECHNOLOGY INC., Taipei (TW)

( * ) Notice: Subject to any disclaimer, the term of this patent is extended or adjusted under 35 U.S.C. 154(b) by 133 days.

(21) Appl. No.: 17/518,747

(22) Filed: Nov. 4, 2021

(65) Prior Publication Data

US 2023/0077529 A1 Mar. 16, 2023

(30) Foreign Application Priority Data

Sep. 10, 2021 (TW) .................................. 110133823

(51) Int. Cl.
*H02M 3/07* (2006.01)
*H02M 1/00* (2006.01)
*G01R 31/52* (2020.01)

(52) U.S. Cl.
CPC ............ *H02M 3/073* (2013.01); *G01R 31/52* (2020.01); *H02M 1/0012* (2021.05)

(58) Field of Classification Search
CPC .............................................. H02M 3/07–073
See application file for complete search history.

(56) References Cited

U.S. PATENT DOCUMENTS

| 6,559,689 | B1 * | 5/2003 | Clark | H03K 17/063 |
| | | | | 327/91 |
| 7,764,526 | B1 * | 7/2010 | Xing | H02M 3/07 |
| | | | | 363/60 |
| 9,979,284 | B2 * | 5/2018 | Jung | H03K 3/0315 |
| 10,680,515 | B2 * | 6/2020 | Giuliano | H02M 3/07 |
| 10,958,162 | B1 * | 3/2021 | Ibrahim | H02M 3/156 |
| 11,043,893 | B1 * | 6/2021 | Pelicia | H03K 5/2472 |
| 11,108,325 | B2 * | 8/2021 | Mahmoudidaryan | |
| | | | | H02M 3/158 |
| 11,646,654 | B2 * | 5/2023 | Liu | H02M 3/072 |
| | | | | 323/282 |
| 2004/0222775 | A1 * | 11/2004 | Muramatsu | H02M 3/07 |
| | | | | 323/282 |
| 2007/0139982 | A1 * | 6/2007 | Ueno | H02M 3/07 |
| | | | | 363/59 |

(Continued)

FOREIGN PATENT DOCUMENTS

| CN | 108258899 A | * | 7/2018 | .............. H02M 1/32 |
| CN | 114765382 A | * | 7/2022 | ....... G01R 19/16538 |

(Continued)

*Primary Examiner* — Sisay G Tiku
(74) *Attorney, Agent, or Firm* — MUNCY, GEISSLER, OLDS & LOWE, PC (57) ABSTRACT

The invention provides a voltage doubler switched capacitor circuit capable of detecting short circuit of flying capacitor and a detection method thereof. The voltage doubler switched capacitor circuit provides a way to connect the flying capacitor in parallel to the charging path, and calculate whether it is charged to a predetermined voltage in the designed charging time interval, and then it can effectively detect whether the flying capacitor is short-circuited.

10 Claims, 4 Drawing Sheets

(56) References Cited

U.S. PATENT DOCUMENTS

| | | | | |
|---|---|---|---|---|
| 2008/0150620 A1* | 6/2008 | Lesso | ................... | H02M 3/07 327/536 |
| 2009/0121781 A1* | 5/2009 | Oyama | ................... | H02M 3/07 327/536 |
| 2009/0121782 A1* | 5/2009 | Oyama | ................... | H03K 7/06 327/536 |
| 2011/0274295 A1* | 11/2011 | Motoki | ................... | H02M 3/07 327/212 |
| 2012/0112724 A1* | 5/2012 | Nishida | ................... | H02M 3/07 323/293 |
| 2012/0187932 A1* | 7/2012 | Singnurkar | ........... | H02M 3/158 323/282 |
| 2012/0218032 A1* | 8/2012 | Nadimpalli | ........... | H02M 3/073 327/536 |
| 2014/0218109 A1* | 8/2014 | Wimpenny | ............. | H03F 3/217 330/251 |
| 2015/0066233 A1* | 3/2015 | Kang | ................... | G06F 1/04 700/298 |
| 2015/0162824 A1* | 6/2015 | Philip | ................... | H02M 1/088 323/272 |
| 2020/0142467 A1* | 5/2020 | Ho | ................... | G06F 1/324 |
| 2020/0303927 A1* | 9/2020 | Tian | ................... | H02M 3/07 |
| 2020/0343757 A1* | 10/2020 | Tian | ................... | H02J 7/00712 |
| 2020/0389132 A1* | 12/2020 | Khlat | ................... | H03F 3/245 |
| 2021/0273559 A1* | 9/2021 | Sandusky | ................ | H02M 1/36 |
| 2022/0029534 A1* | 1/2022 | Chen | ................... | H02M 3/158 |
| 2022/0128632 A1* | 4/2022 | Lai | ................... | H02M 1/36 |

FOREIGN PATENT DOCUMENTS

| | | | | | |
|---|---|---|---|---|---|
| CN | 115792422 A | * | 3/2023 | ............. | G01R 31/52 |
| GB | 2580649 A | * | 7/2020 | ................ | H02P 9/10 |
| WO | WO-0171893 A2 | * | 9/2001 | ............. | H02M 3/07 |
| WO | WO-2021147148 A1 | * | 7/2021 | .......... | H02M 1/0032 |

* cited by examiner

```
┌─────────────────────────────────────────────────────────┐
│ Use a first switch with the larger impedance of a voltage doubler │
│ switched capacitor circuit for a soft start.            │
└─────────────────────────────────────────────────────────┘
                                                    ╲31
                            ↓
┌─────────────────────────────────────────────────────────┐
│ Turn on the first switch to disconnect a second switch and a third │
│ switch, so that a main voltage source charges a stabilizing capacitor. │
└─────────────────────────────────────────────────────────┘
                                                    ╲32
```

33. Use a timer of a detection circuit to determine whether the charging time of the main voltage source for the stabilizing capacitor is less than a preset time.

- No → 38. Turn off the charging pulse and issue a short-circuit warning.
- Yes ↓

34. Determine whether the divided voltage of a voltage output terminal is greater than a second reference voltage of a second comparator.

- No → (back to 32)
- Yes ↓

35. The second switch is turned on and the third switch is turned off, the main voltage source charges a flying capacitor, and the flying capacitor stores the voltage difference as the voltage of the main voltage source.

36. The second switch and the third switch are turned on, and the voltage of the main voltage source of the flying capacitor is discharged to a stabilizing capacitor connected between the voltage output terminals, so that the voltage output terminal is doubled the voltage of the main voltage source.

37. Determine whether the divided voltage of one voltage output terminal is greater than a first reference voltage of a first comparator.

- Yes → 39. Turn off the charging pulse.
- No → (back to 35)

*FIG. 4*

VOLTAGE DOUBLER SWITCHED CAPACITOR CIRCUIT CAPABLE OF DETECTING SHORT CIRCUIT OF FLYING CAPACITOR AND DETECTION METHOD THEREOF

This application claims the priority benefit of Taiwan patent application number 110133823, filed on Sep. 10, 2021.

BACKGROUND OF THE INVENTION

1. Field of the Invention

The present invention relates a voltage doubler switched capacitor circuit capable of detecting short circuit of flying capacitor and detection method thereof, especially it refers to a kind of voltage doubler switched capacitor circuit that connects the flying capacitor in parallel to the charging path, and calculates whether it is charged to a predetermined voltage during the designed charging time interval, and it can effectively detect whether the flying capacitor is short-circuited.

2. Description of the Related Art

The flying capacitor ($C_{FLY}$) and the stabilized capacitor ($C_{OUT}$) are system components outside the integrated circuit (IC), which are soldered to the printed circuit board (PCB) by the manufacturer (system assembly plant), but occasionally there will be soldering excessive or other reasons cause a short circuit at both ends of the flying capacitor ($C_{FLY}$).

Furthermore, all switches in a general circuit will have on-resistance. The larger the switch area, the smaller its on-resistance, and the larger the charging current flowing through the switch, and the faster the time to charge to the rated voltage, but it is also easy to cause inrush current because of too fast, which is easy to damage the load circuit, so the load circuit also needs to have a protection mechanism against inrush current.

However, although the generally known power circuit has an overcurrent protection design, if its stabilizing capacitor ($C_{OUT}$) terminal is continuously short-circuited to ground, the problem of excessive transient inrush current can be prevented. However, because the switches at both ends of the flying capacitor ($C_{FLY}$) are ON/OFF repetitive switching actions, it cannot continue to effectively prevent excessive currents. Moreover, the current conventional circuit does not have a protection circuit design for flying capacitor ($C_{FLY}$) short circuit.

Therefore, the above-mentioned conventional circuit cannot detect the short-circuit status of the flying capacitor ($C_{FLY}$) and the stabilizing capacitor ($C_{OUT}$), and cannot effectively provide a protection mechanism.

SUMMARY OF THE INVENTION

In view of the above-mentioned problems and deficiencies, the inventor collected relevant information, and after multiple evaluations and considerations, the applicant designed this kind of a voltage doubler switched capacitor circuit capable of detecting short circuit of flying capacitor and detection method thereof that can detect the short circuit of the flying capacitor.

The main objective of the present invention is to provide a voltage doubler switched capacitor circuit capable of detecting the short circuit of a flying capacitor. The voltage doubler switched capacitor circuit provides a first switch CKC with a relatively large conduction impedance, which can prevent the inrush current from damaging the load circuit, thereby forming a soft start mechanism, and connects the flying capacitor $C_{FLY}$ in parallel to the charging path in the soft-start phase, and calculates whether it is charged to the predetermined voltage in the designed charging time interval, and then it can effectively detect whether the flying capacitor $C_{FLY}$ is short-circuited. If the flying capacitor $C_{FLY}$ is short-circuited, the current used to charge the stabilizing capacitor $C_{OUT}$ during the soft-start phase will be shunted to the ground side of the flying capacitor $C_{FLY}$ short-circuit, causing the voltage output terminal OUT to fail to charge to the rated voltage. If the stabilizing capacitor $C_{OUT}$ is short-circuited, the voltage output terminal OUT cannot be charged to the rated voltage. The voltage doubler switched capacitor circuit provides a timer as an electronic component for calculating the charging time. In the soft-start charging phase of flying capacitor $C_{FLY}$ and stabilizing capacitor $C_{OUT}$, if the charging time exceeds the preset time, the charging pulse will be stopped to avoid the continuous short current from burning the controller. The preset circuit board on which the voltage doubler switched capacitor circuit is set is also provided with a preset warning circuit that can issue a short alert to warn the flying capacitor $C_{FLY}$ of the preset circuit board is in a short-circuit state.

It is another objective of the present invention to provide a voltage doubler switched capacitor circuit capable of detecting the short circuit of a flying capacitor, which comprises a main voltage source comprising a positive terminal, and a negative terminal electrically connected to a ground side;

a voltage output terminal comprising a first output terminal, and a second output terminal electrically connected to the ground side;

a first switch having two ends thereof connected in series between the positive terminal of the main voltage source and the first output terminal of the voltage output terminal;

two second switches, two third switches and a flying capacitor, one of the second switches and one of the third switches being connected in series between the positive terminal of the main voltage source and the first output terminal of the voltage output terminal, the other third switch and the flying capacitor being connected in series and then connected in parallel at the two ends of the second switch, one end of the other second switch being electrically connected between the other third switch and the flying capacitor, and the other end of the other second switch being electrically connected to the ground side;

a stabilizing capacitor having two ends thereof respectively connected across the first output terminal and the second output terminal;

a first logic gate that controls the on and off of one of the second switches and a second logic gate that controls the on and off of one of the third switches; and a detection circuit having two ends thereof respectively connected across the first output terminal and the second output terminal, the detection circuit comprising a controller, the controller having an input side thereof electrically connected with two comparators, the input side of the controller being for a charging pulse as a signal input, the controller having an output side thereof outputting plural control signals including a first switch control signal, a second switch control signal and a third switch control signal for controlling the first switch, the second switches and the third switches.

It is still another objective of the present invention to provide a voltage doubler switched capacitor circuit capable of detecting the short circuit of a flying capacitor, wherein the detection circuit further comprises a controller. The controller has an input side thereof electrically connected with two comparators. The input side of the controller is for a charging pulse as a signal input. The controller has an output side thereof outputting plural control signals for controlling the first switch, the second switches and the third switches.

It is still another objective of the present invention to provide a voltage doubler switched capacitor circuit capable of detecting the short circuit of a flying capacitor, wherein each comparator comprises a positive phase input terminal and a negative phase input terminal. The positive phase input terminals of the two comparators are respectively provided with a voltage divider across the first output terminal and the second output terminal, so that the output voltage of the voltage output terminal is attenuated and then input to the two positive phase input terminals. The two negative phase input terminals are for a reference voltage as an input.

DETAILED DESCRIPTION OF THE PREFERRED EMBODIMENT

In order to achieve the above-mentioned purpose and effect, the technical means and structure adopted by the present invention, the characteristics and functions of the preferred embodiment of the present invention are described in detail as follows, for the benefit of a complete understanding.

Figure 1:
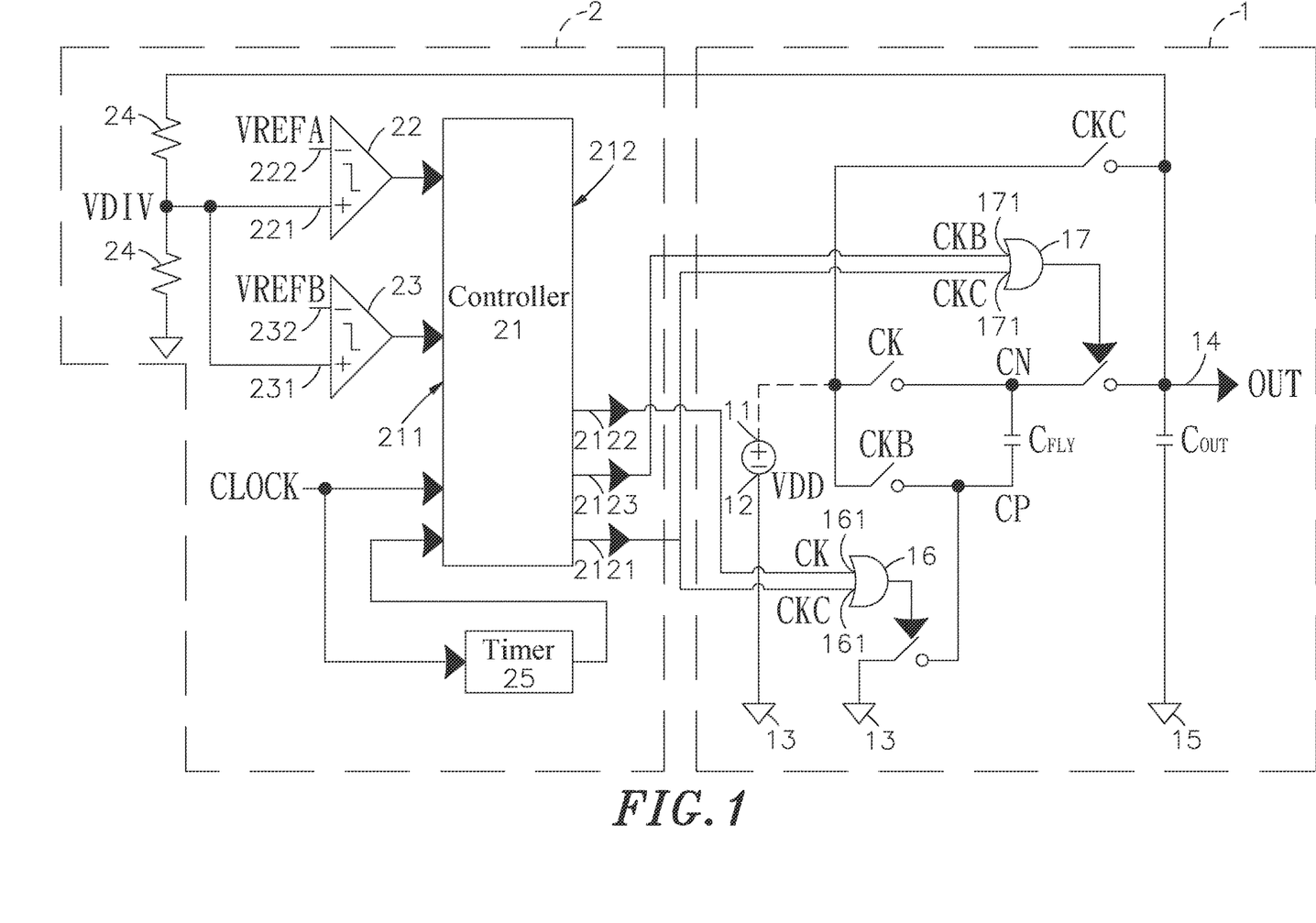
FIG. 1 is a circuit diagram of the voltage doubler switched capacitor circuit of the present invention.
Figure 2:
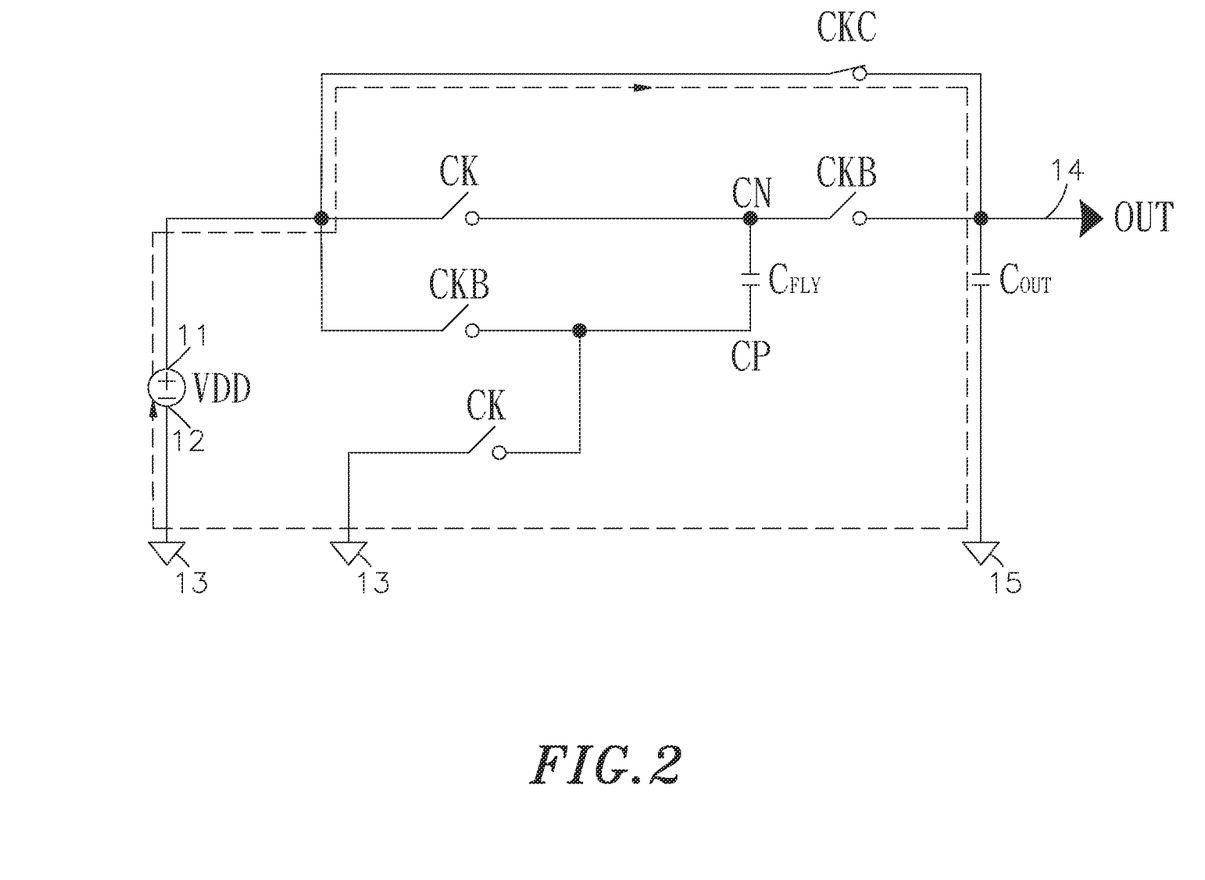
FIG. 2 is a diagram of the first conduction state of the voltage doubler switched capacitor circuit of the present invention.
Figure 3:
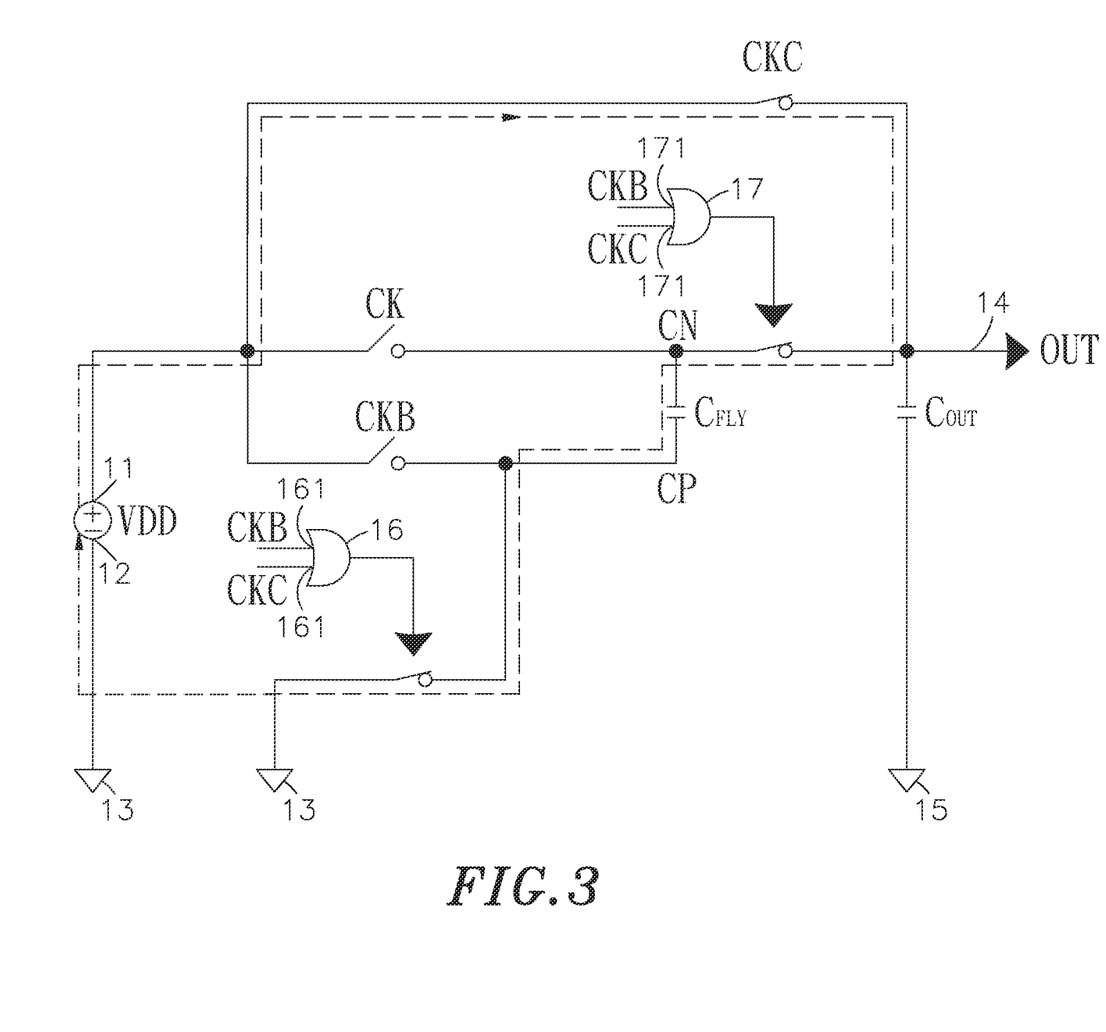
FIG. 3 is a diagram of the second conduction state of the voltage doubler switched capacitor circuit of the present invention.

Please refer to FIGS. 1-3, where FIG. 1 is a circuit diagram of the voltage doubler switched capacitor circuit of the present invention; FIG. 2 is a diagram of the first conduction state of the voltage doubler switched capacitor circuit of the present invention; and FIG. 3 is a diagram of the second conduction state of the voltage doubler switched capacitor circuit of the present invention.

The circuit of the present invention mainly comprises: a voltage doubler switched capacitor circuit 1 and a detection circuit 2. The detailed structure and connection relationship are as follows:

The present invention mainly discloses a voltage doubler switched capacitor circuit with a soft start function, and the switched-capacitor charge pump in the circuit is additionally provided with the function of detecting whether the flying capacitor is short-circuited.

The voltage doubler switched capacitor circuit 1 comprises a main voltage source VDD, a voltage output terminal OUT, a first switch CKC, two second switches CK, two third switches CKB, a flying capacitor $C_{FLY}$, a stabilizing capacitor $C_{OUT}$, and two logic gates.

The main voltage source VDD comprises a positive terminal 11, and a negative terminal 12 electrically connected to a ground side 13.

The voltage output terminal OUT comprises a first output terminal 14, and a second output terminal 15 electrically connected to the ground side 13.

The first switch CKC has the two ends thereof connected in series between the positive terminal 11 of the main voltage source VDD and the first output terminal 14 of the voltage output terminal OUT.

One second switch CK and one third switch CKB are connected in series between the positive terminal 11 of the main voltage source VDD and the first output terminal 14 of the voltage output terminal OUT. The other third switch CKB and the flying capacitor $C_{FLY}$ are connected in series and then connected in parallel at the two ends of the second switch CK. One end of the other second switch CK is electrically connected between the other third switch CKB and the flying capacitor $C_{FLY}$, and the other end of the other second switch CK is electrically connected to the ground side 13.

The two ends of the stabilizing capacitor $C_{OUT}$ are respectively connected across the first output terminal 14 and the second output terminal 15.

The two logic gates include a first logic gate 16 that controls the on and off of one of the second switches CK and a second logic gate 17 that controls the on and off of one of the third switches CKB.

The two ends of the detection circuit 2 are respectively connected across the first output terminal 14 and the second output terminal 15. The detection circuit 2 comprises a controller 21. One input side 211 of the controller 21 is electrically connected with two comparators (first comparator 22, second comparator 23) with two voltage input terminals. The input side 211 of the controller 21 is for a charging pulse CLOCK as a signal input. One output side 212 of the controller 21 outputs plural control signals (first switch control signal 2121, second switch control signal 2122, third switch control signal 2123) that can control the first switch CKC, the second switches CK, and the third switches CKB.

The above two logic gates each are composed of an OR Gate. Two input terminals 161 of the first logic gate 16 are respectively connected to the first switch control signal 2121 and the second switch control signal 2122 output by the output side 212 of the controller 21. Two input terminals 171 of the second logic gate 17 are respectively connected to the first switch control signal 2121 and the third switch control signal 2123 output by the output side 212 of the controller 21. The input and output comparison table of the first logic gate 16 and the second logic gate 17 is as follows:

First Logic Gate 16:

| first switch control signal (first input value) | second switch control signal (second input value) | output value |
| --- | --- | --- |
| 0 | 0 | 0 |
| 0 | 1 | 1 |
| 1 | 0 | 1 |
| 1 | 1 | 1 |

Second Logic Gate 17:

| first switch control signal (first input value) | third switch control signal (second input value) | output value |
|---|---|---|
| 0 | 0 | 0 |
| 0 | 1 | 1 |
| 1 | 0 | 1 |
| 1 | 1 | 1 |

It can be seen from the above two comparison tables, the first switch control signal 2121 is combined with the second switch control signal 2122 or the third switch control signal 2123 to form a first input value and a second input value, as long as either input value is not 0, its output value is 1; only when both input values are 0, its output value will be 0.

The two voltage input terminals of the above-mentioned two comparators (first comparator 22 and second comparator 23) each comprise a positive phase input terminal 221, 231 and a negative phase input terminal 222, 232. The positive phase input terminals 221, 231 of the two comparators (first comparator 22, second comparator 23) are provided with a voltage divider 24 across the first output terminal 14 and the second output terminal 15, so that a divided voltage VDIV of a voltage output terminal between the two voltage dividers 24 input into the two positive phase input terminals 221, 231. The two negative phase input terminals 222, 232 of the two comparators (first comparator 22, second comparator 23) are each provided with a first reference voltage VREFA and a second reference voltage VREFB as an input.

The input side 211 of the controller 21 is electrically connected to a timer 25. The timer 25 is used to determine whether the charging time of the main voltage source VDD to the stabilizing capacitor $C_{OUT}$ is less than a preset time.

The capacitance value of the stabilizing capacitor $C_{OUT}$ is greater than that of the flying capacitor $C_{FLY}$, and the capacitance value range of the flying capacitor $C_{FLY}$ is 0.5 to 0.05 times that of the stabilizing capacitor $C_{OUT}$.

Figure 4:
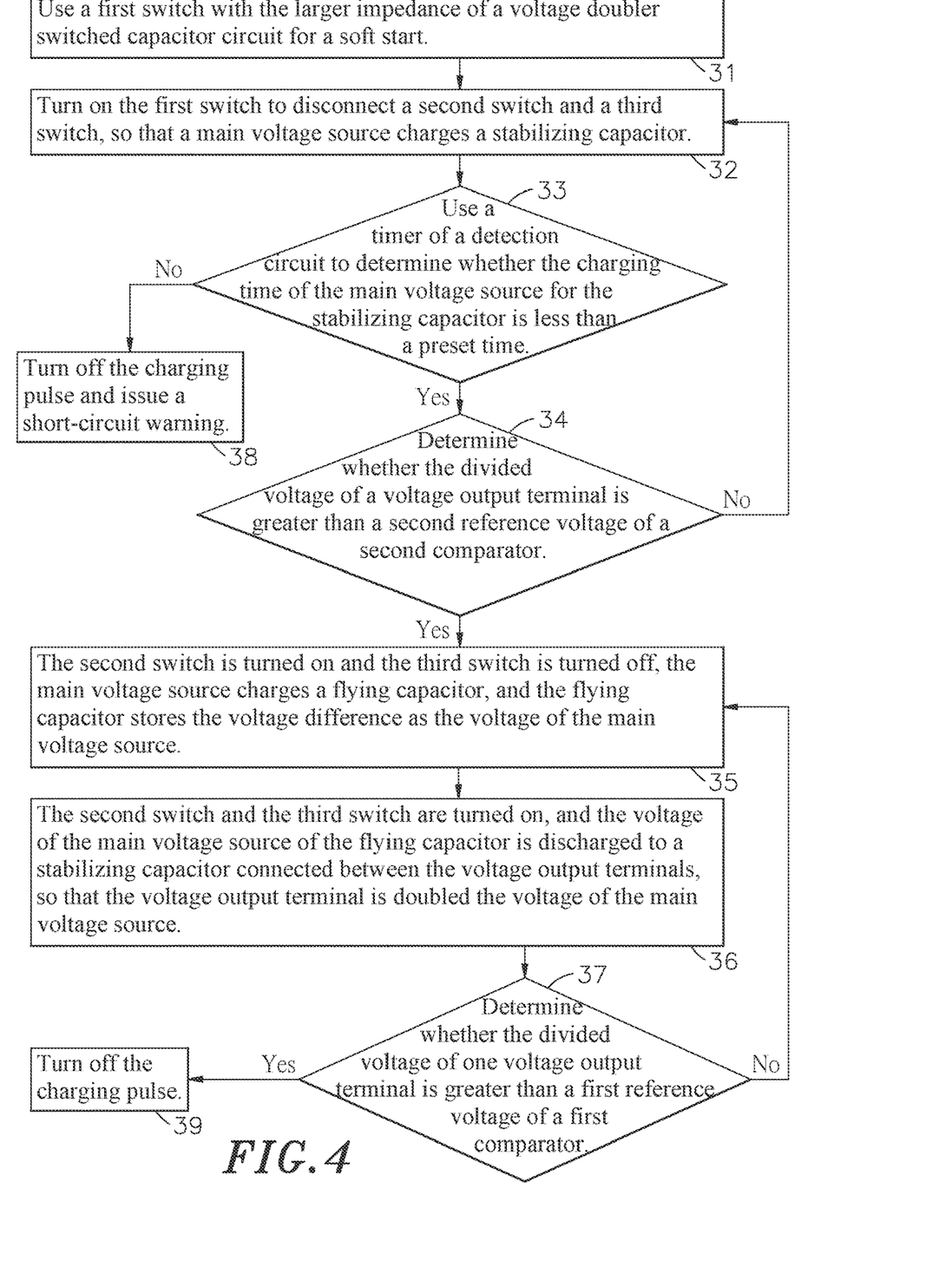
FIG. 4 is a flow chart of the detection method of the voltage doubler switched capacitor circuit in detecting the short circuit of the flying capacitor according to the present invention.

Please refer to FIG. 4, which is a flow chart of the detection method of the voltage doubler switched capacitor circuit in detecting the short circuit of the flying capacitor according to the present invention. The detection method comprises the following steps:

Step 31: Use a first switch with the larger impedance of the voltage doubler switched capacitor circuit (as shown in FIGS. 1 to 3) for a soft start.

Step 32: The first switch is turned on, and a second switch and a third switch are disconnected, so that a main voltage source charges a stabilizing capacitor.

Step 33: Use a timer of a detection circuit to determine whether the charging time of the main voltage source for the stabilizing capacitor is less than a preset time, if yes, go to step 34; if not, go to step 38.

Step 34: Determine whether a divided voltage of a voltage output terminal is greater than a second reference voltage of a second comparator.

Step 35: The second switch is turned on and the third switch is turned off, the main voltage source charges a flying capacitor, and the flying capacitor stores the voltage difference as the voltage of the main voltage source.

Step 36: The second switch and the third switch are turned on, and the voltage of the main voltage source of the flying capacitor is discharged to a stabilizing capacitor connected between the voltage output terminals, so that the voltage output terminal is doubled the voltage of the main voltage source.

Step 37: Determine whether the divided voltage of one voltage output terminal is greater than a first reference voltage of a first comparator, if yes, go to step 39; if not, go to step 35.

Step 38: Turn off the charging pulse and issue a short-circuit warning.

Step 39: Turn off the charging pulse.

The voltage doubler switched capacitor circuit in step 31 above comprises:

a main voltage source VDD comprising a positive terminal 11 and a negative terminal 12 electrically connected to a ground side 13;

a voltage output terminal OUT comprising a first output terminal 14, and a second output terminal 15 electrically connected to the ground side 13;

a first switch CKC that has the two ends thereof connected in series between the positive terminal 11 of the main voltage source VDD and the first output terminal 14 of the voltage output terminal OUT;

two second switches CK, two third switches CKB and a flying capacitor $C_{FLY}$, wherein one second switch CK and one third switch CKB are connected in series between the positive terminal 11 of the main voltage source VDD and the first output terminal 14 of the voltage output terminal OUT; the other third switch CKB and the flying capacitor $C_{FLY}$ are connected in series and then connected in parallel at the two ends of the second switch CK; one end of the other second switch CK is electrically connected between the other third switch CKB and the flying capacitor $C_{FLY}$, and the other end of the other second switch CK is electrically connected to the ground side 13;

a stabilizing capacitor $C_{OUT}$ with two ends thereof respectively connected across the first output terminal 14 and the second output terminal 15;

two logic gates including a first logic gate 16 that controls the on and off of one of the second switches CK and a second logic gate 17 that controls the on and off of one of the third switches CKB; and a detection circuit 2 with two ends thereof respectively connected across the first output terminal 14 and the second output terminal 15, wherein the detection circuit 2 comprises a controller 21; one input side 211 of the controller 21 is electrically connected with two comparators (first comparator 22, second comparator 23) with two voltage input terminals; the input side 211 of the controller 21 is for a charging pulse CLOCK as a signal input; one output side 212 of the controller 21 outputs plural control signals (first switch control signal 2121, second switch control signal 2122, third switch control signal 2123) that can control the first switch CKC, the second switches CK, and the third switches CKB.

The two voltage input terminals of the above-mentioned two comparators (first comparator 22 and second comparator 23) each comprise a positive phase input terminal 221, 231 and a negative phase input terminal 222, 232. The positive phase input terminals 221, 231 of the two comparators (first comparator 22, second comparator 23) are provided with a voltage divider 24 across the first output terminal 14 and the second output terminal 15, so that the divided voltage VDIV of a voltage output terminal between the two voltage dividers 24 input into the two positive phase input terminals 221, 231. The two negative phase input terminals 222, 232 of the two comparators (first comparator 22, second comparator 23) are each provided with a first reference voltage VREFA and a second reference voltage VREFB as an input.

The detection circuit 2 in the step 33 above further comprises a controller 21. One input side 211 of the controller 21 is electrically connected with two comparators (first comparator 22, second comparator 23) with two voltage input terminals. The input side 211 of the controller 21 is for a charging pulse CLOCK as a signal input. One output side 212 of the controller 21 outputs plural control signals (first switch control signal 2121, second switch control signal 2122, third switch control signal 2123) that can control the first switch CKC, the second switches CK, and the third switches CKB.

The capacitance value of the stabilizing capacitor $C_{OUT}$ is greater than that of the flying capacitor $C_{FLY}$, and the capacitance value range of the flying capacitor $C_{FLY}$ is 0.5 to 0.05 times that of the stabilizing capacitor $C_{OUT}$.

The problem to be solved by the present invention is that the voltage doubler switched capacitor circuit 1 provides a first switch CKC with a relatively large conduction impedance, which can prevent the inrush current from damaging the load circuit, thereby forming a soft start mechanism, and connects the flying capacitor $C_{FLY}$ in parallel to the charging path in the soft-start phase, and calculates whether it is charged to the predetermined voltage in the designed charging time interval, and then it can effectively detect whether the flying capacitor $C_{FLY}$ is short-circuited. If the flying capacitor $C_{FLY}$ is short-circuited, the current used to charge the stabilizing capacitor $C_{OUT}$ during the soft-start phase will be shunted to the ground side of the flying capacitor $C_{FLY}$ short-circuited, causing the voltage output terminal OUT to fail to charge to the rated voltage. If the stabilizing capacitor $C_{OUT}$ is short-circuited, the voltage output terminal OUT cannot be charged to the rated voltage. The voltage doubler switched capacitor circuit 1 provides a timer 25 as an electronic component for calculating the charging time. In the soft-start charging phase of flying capacitor $C_{FLY}$ and stabilizing capacitor $C_{OUT}$, if the charging time exceeds the preset time, the charging pulse will be stopped to avoid the continuous short current from burning the controller 21. The preset circuit board (not shown) on which the voltage doubler switched capacitor circuit 1 is set is also provided with a preset warning circuit (not shown) that can issue a short alert to warn the flying capacitor $C_{FLY}$ of the preset circuit board is in a short-circuit state.

The above are only the preferred embodiments of the present invention, and the scope of the patent of the present invention is not limited thereby. All simple modifications and equivalent structural changes made by using the description and schematic content of the present invention shall be included in the patent scope of the present invention in the same way.

In summary, the voltage doubler switched capacitor circuit capable of detecting short circuit of flying capacitor and detection method thereof of the present invention can indeed achieve its effect and purpose when used. Therefore, the present invention is truly an invention with excellent practicability. In order to meet the requirements of the invention patent application, the application is filed in accordance with the law. The applicant hopes that the review committee will grant this application as soon as possible to protect the inventor's hard-working invention. If the review committee has any doubts, please feel free to write instructions.

What the invention claimed is:

1. A voltage doubler switched capacitor circuit capable of detecting a short circuit of a flying capacitor, comprising:
    a main voltage source comprising a positive terminal, and a negative terminal electrically connected to a ground side;
    a voltage output terminal comprising a first output terminal, and a second output terminal electrically connected to the ground side;
    a first switch having first and second ends thereof connected in series between the positive terminal of the main voltage source and the first output terminal of the voltage output terminal;
    a second switch, a third switch, a fourth switch, a fifth switch and the flying capacitor, the second switch and the fourth switch being connected in series between the positive terminal of the main voltage source and the first output terminal of the voltage output terminal, the fifth switch and the flying capacitor being connected in series and then connected in parallel at first and second ends of the second switch, a first end of the third switch being electrically connected between the fifth switch and the flying capacitor, and a second end of the third switch being electrically connected to the ground side;
    a stabilizing capacitor having first and second ends thereof respectively connected across the first output terminal and the second output terminal;
    a first logic gate that controls on and off of one of the second and third switches and a second logic gate that controls on and off of one of the fourth and fifth switches; and
    a detection circuit having first and second ends thereof respectively connected across the first output terminal and the second output terminal, the detection circuit comprising a controller, the controller having an input side thereof electrically connected with first and second comparators, the input side of the controller being for a charging pulse as a signal input, the controller having an output side thereof outputting plural control signals including a first switch control signal, a second switch control signal and a third switch control signal for controlling the first switch, the second and third switches and the fourth and fifth switches.

2. The voltage doubler switched capacitor circuit capable of detecting the short circuit of the flying capacitor as claimed in claim 1, wherein the first logic gate and the second logic gate each are composed of an OR Gate, the first logic gate having first and second input terminals thereof respectively connected to the first switch control signal and the second switch control signal output by the output side of the controller, the second logic gate having third and fourth input terminals thereof respectively connected to the first switch control signal and the third switch control signal output by the output side of the controller.

3. The voltage doubler switched capacitor circuit capable of detecting the short circuit of the flying capacitor as claimed in claim 1, wherein each of the first and second comparators comprises a voltage input terminal, and the voltage input terminal of each of the first and second comparators comprises a positive phase input terminal and a negative phase input terminal, the positive phase input terminal of each of the first and second comparators being respectively provided with a voltage divider across the first output terminal and the second output terminal, so that a divided voltage of the voltage output terminal between the voltage dividers of the first and second comparators input into the positive phase input terminal of each of the first and second comparators, the negative phase input terminal of each of the first and second comparators being provided with a first reference voltage and a second reference voltage as an input.

4. The voltage doubler switched capacitor circuit capable of detecting the short circuit of the flying capacitor as claimed in claim 1, wherein the input side of the controller is electrically connected to a timer, the timer is used to determine whether a charging time of the main voltage source to the stabilizing capacitor is less than a preset time.

5. The voltage doubler switched capacitor circuit capable of detecting the short circuit of the flying capacitor as claimed in claim 1, wherein a capacitance value of the stabilizing capacitor is greater than that of the flying capacitor, and a capacitance value range of the flying capacitor is 0.5 to 0.05 times that of the stabilizing capacitor.

6. A detection method of a voltage doubler switched capacitor circuit capable of detecting a short circuit of a flying capacitor, comprising the steps of:
   A: using a first switch with a larger impedance of the voltage doubler switched capacitor circuit for a soft start;
   B: turning on the first switch to disconnect a second switch and a third switch, so that a main voltage source charges a stabilizing capacitor;
   C: using a timer of a detection circuit to determine whether a charging time of the main voltage source for the stabilizing capacitor is less than a preset time, if yes, going to step D; if not, going to step H;
   D: determining whether a divided voltage of a voltage output terminal is greater than a second reference voltage of a second comparator;
   E: turning on the second switch and turning off the third switch, so that the main voltage source charges the flying capacitor, and the flying capacitor stores a voltage difference as a voltage of the main voltage source;
   F: turning on the second switch and the third switch to let the voltage of the main voltage source of the flying capacitor be discharged to the stabilizing capacitor connected between the voltage output terminals, so that the voltage output terminal is doubled the voltage of the main voltage source;
   G: determining whether the divided voltage of one of the voltage output terminals is greater than a first reference voltage of a first comparator, if yes, going to step I; if not, going to step E;
   H: turning off a charging pulse and issuing a short-circuit warning;
   I: turning off the charging pulse.

7. The detection method of the voltage doubler switched capacitor circuit capable of detecting the short circuit of the flying capacitor as claimed in claim 6, wherein the voltage doubler switched capacitor circuit in step A comprises:
   the main voltage source comprising a positive terminal, and a negative terminal electrically connected to a ground side;
   the voltage output terminal comprising a first output terminal, and a second output terminal electrically connected to the ground side;
   the first switch having first and second ends thereof connected in series between the positive terminal of the main voltage source and the first output terminal of the voltage output terminal;
   a second switch, a third switch, a fourth switch, a fifth switch and the flying capacitor, the second switch and the fourth switch being connected in series between the positive terminal of the main voltage source and the first output terminal of the voltage output terminal, the fifth switch and the flying capacitor being connected in series and then connected in parallel at first and second ends of the second switch, a first end of the third switch being electrically connected between the fifth switch and the flying capacitor, and other end of the third switch being electrically connected to the ground side;
   the stabilizing capacitor having first and second ends thereof respectively connected across the first output terminal and the second output terminal;
   a first logic gate that controls on and off of one of the second and third switches and a second logic gate that controls on and off of one of the fourth and fifth switches; and
   the detection circuit having first and second ends thereof respectively connected across the first output terminal and the second output terminal, the detection circuit comprising a controller, the controller having an input side thereof electrically connected with first and second comparators, the input side of the controller being for the charging pulse as a signal input, the controller having an output side thereof outputting plural control signals including a first switch control signal, a second switch control signal and a third switch control signal for controlling the first switch, the second and third switches and the fourth and fifth switches.

8. The detection method of the voltage doubler switched capacitor circuit capable of detecting the short circuit of the flying capacitor as claimed in claim 7, wherein each of the first and second comparators comprises a voltage input terminal, and the voltage input terminal of each of the first and second comparators comprises a positive phase input terminal and a negative phase input terminal, the positive phase input terminal of each of the first and second comparators being provided with a voltage divider across the first output terminal and the second output terminal, so that the divided voltage of the voltage output terminal between the voltage dividers of the first and second comparators input into the positive phase input terminal of each of the first and second comparators, the negative phase input terminal of each of the first and second comparators being provided with the first reference voltage and the second reference voltage as an input.

9. The detection method of the voltage doubler switched capacitor circuit capable of detecting the short circuit of the flying capacitor as claimed in claim 6, wherein the detection circuit in Step C further comprises a controller, the controller having an input side thereof electrically connected with first and second comparators, the input side of the controller being for the charging pulse as a signal input, the controller having an output side thereof outputting plural control signals including a first switch control signal, a second switch control signal and a third switch control signal for controlling the first switch, the second and third switches and the fourth and fifth switches.

10. The detection method of the voltage doubler switched capacitor circuit capable of detecting the short circuit of the flying capacitor as claimed in claim 6, wherein a capacitance value of the stabilizing capacitor is greater than that of the flying capacitor, and a capacitance value range of the flying capacitor is 0.5 to 0.05 times that of the stabilizing capacitor.

* * * * *